United States Patent
Lee et al.

(10) Patent No.: US 6,777,305 B2
(45) Date of Patent: Aug. 17, 2004

(54) METHOD FOR FABRICATING SEMICONDUCTOR DEVICE

(75) Inventors: Kee-Jeung Lee, Ichon (KR); Byung-Seop Hong, Ichon (KR)

(73) Assignee: Hynix Semiconductor Inc., Ichon (JP)

( * ) Notice: Subject to any disclaimer, the term of this patent is extended or adjusted under 35 U.S.C. 154(b) by 0 days.

(21) Appl. No.: 10/238,637

(22) Filed: Sep. 11, 2002

(65) Prior Publication Data

US 2003/0054634 A1 Mar. 20, 2003

(30) Foreign Application Priority Data

Sep. 14, 2001 (KR) .......................................... 2001-56742

(51) Int. Cl.⁷ .............................................. H01L 21/20
(52) U.S. Cl. ...................... 438/396; 438/254; 438/397; 438/672; 438/675
(58) Field of Search ................................ 438/253, 254, 438/255, 256, 396, 397, 398, 399, 666, 667, 668, 669, 672, 637

(56) References Cited

U.S. PATENT DOCUMENTS

| | | | |
|---|---|---|---|
| 5,521,121 A | * | 5/1996 | Tsai et al. .................... 438/627 |
| 5,597,756 A | * | 1/1997 | Fazan et al. ................ 438/398 |
| 6,010,942 A | * | 1/2000 | Chien et al. ................ 438/396 |
| 6,146,968 A | | 11/2000 | Lu et al. |
| 6,153,510 A | | 11/2000 | Ishibashi |
| 6,165,840 A | | 12/2000 | Choi et al. |
| 6,184,081 B1 | | 2/2001 | Jeng et al. |
| 6,214,689 B1 | * | 4/2001 | Lim et al. .................... 438/398 |
| 6,218,260 B1 | * | 4/2001 | Lee et al. .................... 438/398 |
| 6,225,160 B1 | * | 5/2001 | Lin et al. .................... 438/255 |
| 6,228,700 B1 | | 5/2001 | Lee |
| 6,232,175 B1 | | 5/2001 | Liu et al. |
| 6,562,679 B2 | * | 5/2003 | Lee et al. .................... 438/253 |

FOREIGN PATENT DOCUMENTS

| | | |
|---|---|---|
| JP | 2001-36044 | 2/2001 |
| JP | 2001-44377 | 2/2001 |
| JP | 2001-53246 | 2/2001 |
| JP | 2001-53249 | 2/2001 |
| KR | 2001-46663 | 6/2001 |
| KR | 2001-68611 | 7/2001 |

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

A method for fabricating a semiconductor device is disclosed. A spacer is formed on the sidewall of the contact hole in which a storage node contact plug is buried. An etch barrier film and an insulating film are sequentially formed after the formation of the storage node contact plug. The insulating film and the etch barrier film are sequentially etched to form an opening part. Then a storage node is formed within the opening part which has been formed by an etching. Then prominences are formed on the surface of the storage node.

17 Claims, 13 Drawing Sheets

METHOD FOR FABRICATING SEMICONDUCTOR DEVICE

CROSS REFERENCE TO RELATED APPLICATIONS

Priority is claimed from Republic of Korea Patent Application No. 2001-56742 filed Sep. 14, 2001, the entire contents of which are incorporated herein.

FIELD OF THE INVENTION

The present invention relates to a method for fabricating a semiconductor device. Particularly, the present invention relates to a method for fabricating a semiconductor device, in which a plug is involved.

BACKGROUND OF THE INVENTION

As semiconductor devices undergo increases in component density and miniaturization, in order to increase speed, the area occupied by capacitors in semiconductor devices is decreased. As semiconductor devices undergo increases in component density and miniaturization, capacitors have to retain minimum values of capacitance.

In order to establish the capacitance of the capacitor, the lower electrode of the capacitor is fabricated in various configurations, such as, cylindrical structures, stacked structures, pin structures, or concave structures. These structures allow the effective area of the lower electrode of the capacitor to be maximized within limited areas.

In another method of establishing the capacitance of the capacitor, materials having a high dielectric constant, such as barium strontium titanate (BST), or $Ta_2O_5$, are used in the capacitor. If a dielectric material such as BST or Ta2O5 is used, the upper and lower electrodes of the capacitor are made of platinum (Pt), ruthenium (Ru) or TiN because of considerations of electrical properties.

Particularly, where the lower electrode of the capacitor is fabricated using the metals mentioned above, a transistor including a word line and bit line is formed on a semiconductor substrate, and then, a capacitor contact plug is formed for connecting the capacitor to the transistor. Then a lower electrode is connected to the capacitor contact plug, thereby forming a polysilicon plug (PP) structure. The PP structure is known to be suitable for fabricating a high density semiconductor devices.

FIG. 1 illustrates the layout of a conventional semiconductor device. As shown in FIG. 1, a word line (WL) and a bit line (BL) are formed on a semiconductor substrate 11 in a mutually crossing structure. On a region of semiconductor substrate 11 where the word line and the bit line cross each other, is formed a storage node contact plug (SNC) to which a storage node will be contacted.

FIGS. 2A to 2D are cross-sectional views taken along dashed line A–A' of FIG. 1 showing the conventional fabricating method for a semiconductor device. Here, a capacitor over bit line (COB) structure is formed.

As shown in FIG. 2A, on semiconductor substrate 11 on which a transistor (not illustrated) including a word line and a source/drain has been formed, there is deposited a first interlayer insulating film 12. Then a flattening process is performed.

Then, first interlayer insulating film 12 is selectively etched to form a contact hole so as to expose a relevant portion (source or drain) of semiconductor substrate 11. Then a first polysilicon plug 13 is buried into the contact hole.

In an alternative method for fabricating first polysilicon plug 13, polysilicon is deposited on the entire surface including the word line, and then, etching is performed in a line pattern. Then, a first interlayer insulating film 12 is deposited, and then chemical-mechanical polishing is performed until a surface of the word line is exposed, thereby completing the process.

Here, first polysilicon plug 13 is the contact plug which will be contacted to the bit line and the storage node contact. In the drawing, there is illustrated only the portion to which the storage node contact is to be contacted.

Next, a second interlayer insulating film 14 is deposited on first interlayer insulating film 12 in which the first polysilicon plug has been buried, and then, a flattening process is performed. Then a plurality of bit lines 15 are formed at certain gaps on second interlayer insulating film 14.

Then, spacers 16 are formed on both of the sidewalls of bit lines 15. A third interlayer insulating film 17 is deposited on the entire surface including bit line 15, and then, a flattening process is performed. A barrier nitride film 18 and a buffer oxide film 19 are then sequentially formed on flattened third interlayer insulating film 17. A storage node contact mask 20 is formed on buffer oxide layer 19 by using a photoresist film.

As shown in FIG. 2B, first buffer oxide film 19 and barrier nitride film 18 are etched using storage node contact mask 20. Third interlayer insulating film 17 and second interlayer insulating film 14 are also etched to form a storage node contact hole 21 to expose the surface of first polysilicon plug 13 between bit lines 15 (referred to as "self-aligned contact" below). Then, storage node contact mask 20 is removed.

As shown in FIG. 2C, a polysilicon film is deposited on the entire surface including storage node contact hole 21, and then, the polysilicon film is etched back to form a second polysilicon plug 22 (referred to as "storage node contact plug" below) which is vertically contacted with first polysilicon plug 13.

Then, an oxide film 23 (referred to as "capacitor oxide film" below), a hard mask 24 and a reflection preventing mask 25 are sequentially deposited on buffer oxide film 20 including storage node contact plug 22. Oxide film 23 determines the height and the shape of the storage node.

A storage node mask (not illustrated) is formed on reflection preventing film 25 by using a photoresist film. Reflection preventing film 25, hard mask 24 and capacitor oxide film 23 are etched by utilizing the storage node mask to form a concave part 26 so as to expose a surface of storage node contact plug 22.

As shown in FIG. 2D, the storage node mask is removed, and then, a storage node 27 is formed only in concave part 26. Prominences, such as meta-stable polysilicon (MPS) 28, are grown.

The process of forming storage node 27 and MPS 28 is performed in the following manner. First, without isolating the cells from each other, MPS 28 is grown on the surface of storage node 27. Storage node 27 is isolated by performing a chemical-mechanical polishing. Or, alternatively, storage node 27 is first isolated, and then, MPS 28 is grown on its surface. Then, a dielectric node 29 and a plate node 30 are sequentially deposited on the entire surface including isolated storage nodes 27.

In the above described conventional technique, the buffer oxide film is also etched during etching of the capacitor oxide film. As show in FIG. 3A, the storage node contact plug protrudes above the barrier nitride film (Section B by about 1000 Å (refer to the portion B of FIG. 3a). As a result, the area of the storage node is decreased. Particularly as shown in FIG. 3B, if a misalignment occurs during the process of forming the storage node mask, a bridge is formed between the storage node and an adjacent storage node contact plug (Section B' of FIG. 3B).

Further, when forming the storage node plug, if a misalignment occurs during the contact mask process, then a current leakage occurs between the bit line and the storage node contact plug. This current leakage affects the yield of the self-aligned contact etching (SAC). Particularly, in the 0.13 μm semiconductor product group, in which a fine wiring width is applied, this phenomenon has more serious consequences.

Further, in the above described conventional technique, the chemical-mechanical polishing (CMP) is performed for isolating the storage node after forming the MPS, and thus, the MPS grains are broken. Further, the broken pieces of the grains are not completely removed during a subsequent wet wash process, and therefore, the broken pieces remain buried within the storage node.

Thus, in the dielectric medium which is deposited by the chemical vapor deposition method (CVD), an increases in the leakage current in the capacitor occurs. An increase in leakage current may also be caused by due a stepped difference cladding of the upper electrode. Further, if the MPS pieces are buried between the storage nodes, then a bridge is formed, thereby generating double-bit defects.

The effects of chemical-mechanical polishing carried out after the formation of the MPS is overcome by the method described herein. That is, the storage nodes are isolated from each other by performing a chemical-mechanical polishing, and then, the MPS is grown on the surface of the storage node.

This method may overcome the breaking of the MPS grains during the chemical-mechanical polishing. However, an MPS seed will be partly grown on the uppermost non-crystalline silicon layer of the storage node (which is the lower electrode) during the growing of the MPS (this will be called "out-growing" below). As a result, either the gaps between the storage nodes are narrowed, or in a worst case, bridges are formed between the nodes, thereby generating double-bit defects.

SUMMARY OF THE INVENTION

An aspect related to the present invention provides a method for fabricating a semiconductor device in which there can be prevented the formation of bridges between storage nodes and storage node contact plugs and between bit lines and the storage node contact plugs due to a misalignment in the masking process.

Another aspect related to the present invention provides a method for fabricating a capacitor in which MPS growing can be carried out on the uppermost surface of the storage node, and the formation of bridges between the storage nodes during the MPS out-growing can be inhibited.

Another aspect related to the present invention provides a method for fabricating a capacitor in which the reduction of the area of the storage node due to the exposure of the storage node contact plug after an etch of the capacitor oxide film can be inhibited.

In one aspect related to the present invention, a method for fabricating a contact plug according to the present invention includes the steps of forming an insulating film on a semiconductor substrate; selectively etching the insulating film to form a contact hole so as to expose the semiconductor substrate; forming a spacer on a side wall of the contact hole; and plugging a conductive film into the contact hole.

In another aspect of the present invention, a method for fabricating a capacitor according to the present invention includes the steps of forming a first insulating film on a semiconductor substrate, and forming a contact plug through the first insulating film; sequentially forming an etch barrier film and a second insulating film upon the first insulating film; sequentially etching the second insulating film and the etch barrier film to form an opening part so as to expose the contact plug; forming a conductive film on the second insulating film and on the opening part; selectively etching the conductive film, with the conductive film being over-etched relative to the second insulating film, so as to form a storage node within the opening part; forming prominences on a surface of the storage node; and sequentially forming a dielectric film and a plate node upon the storage node.

In still another aspect of the present invention, a method for fabricating a semiconductor device according to the present invention includes the steps of forming a first insulating film on a semiconductor substrate; forming a plurality of bit lines on the first insulating film; forming a contact hole through the first insulating film between the bit lines to reach the semiconductor substrate; forming a spacer on a side wall of the contact hole; forming a first contact plug, the first contact plug being buried into the contact hole to reach the semiconductor substrate; sequentially forming an etch barrier film and a second insulating film on the first insulating film and upon the first contact plug; sequentially etching the second insulating film and the etch barrier film to form an opening part so as to expose the first contact plug; forming a first conductive film on an entire surface (including the opening part); selectively etching the first conductive film, with the first conductive film being over-etched relative to the second insulating film, so as to form a storage node within the opening part; and sequentially forming a dielectric film and a plate node upon the storage node.

Additional aspects related to the present invention will be set forth in part in the description which follows, and in part will be obvious from the description, or may be learned by practice of the invention. Certain aspect related to the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several aspects related to the present invention and together with the description, serve to explain the principles of the invention.

DESCRIPTION OF THE EMBODIMENTS

Reference will now be made in detail to various aspects related to the present invention, examples of which are illustrated in the accompanying drawings. The present invention will be described in detail referring to the attached drawings in such a manner that the present invention can be easily carried out by those ordinarily skilled in the art. Wherever possible, the same reference numbers will be used throughout the drawings to refer to the same or like parts.

FIGS. 4a to 4d are cross-sectional views showing a contact plug fabrication method in one aspect related to the present invention.

Figure 1:
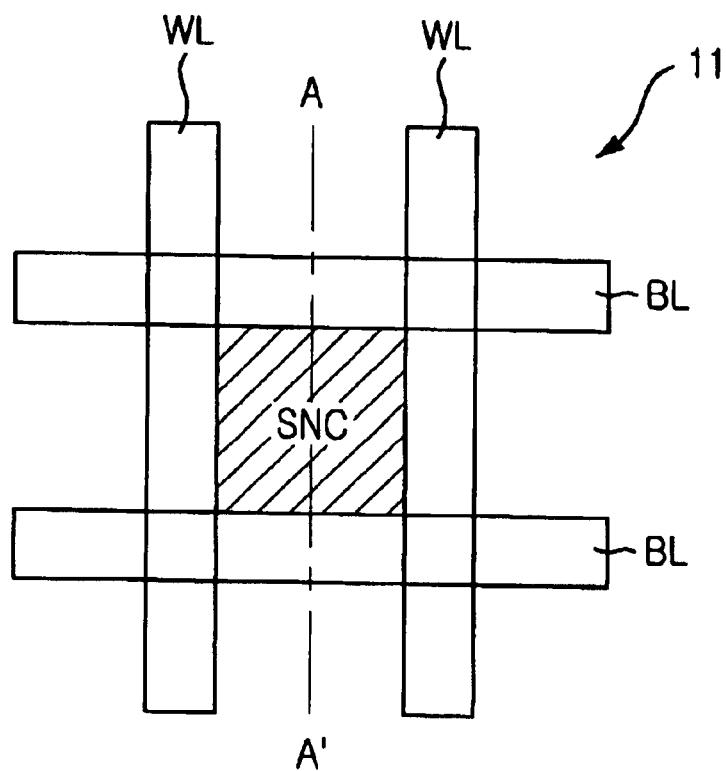
FIG. 1 is a plan view of a conventional general semiconductor device.
Figure 2A:
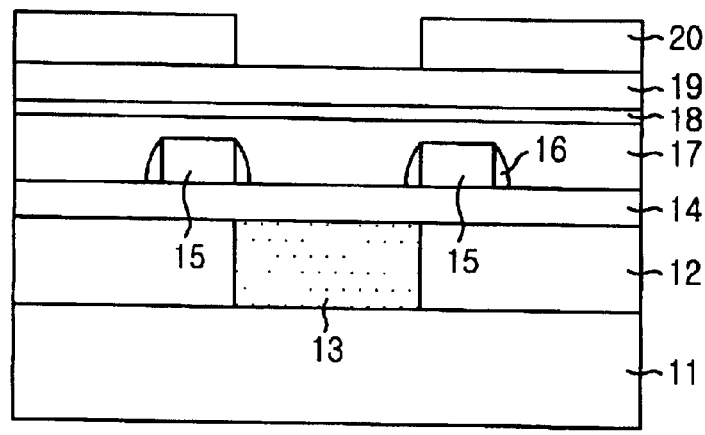
FIGS. 2A to 2D are cross-sectional views showing a conventional fabricating method for a semiconductor device.
Figure 2B:
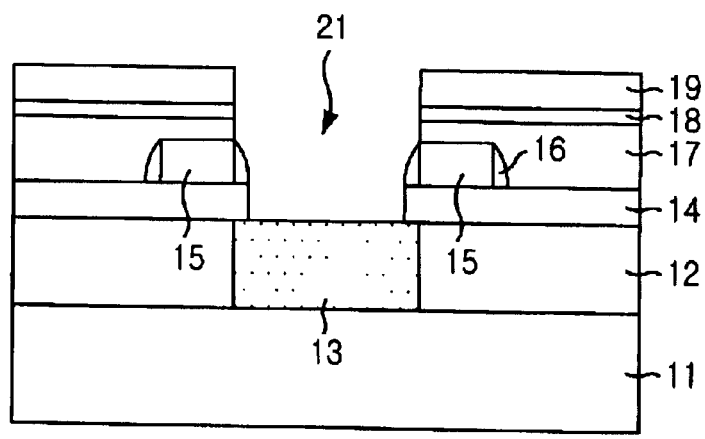
Figure 2C:
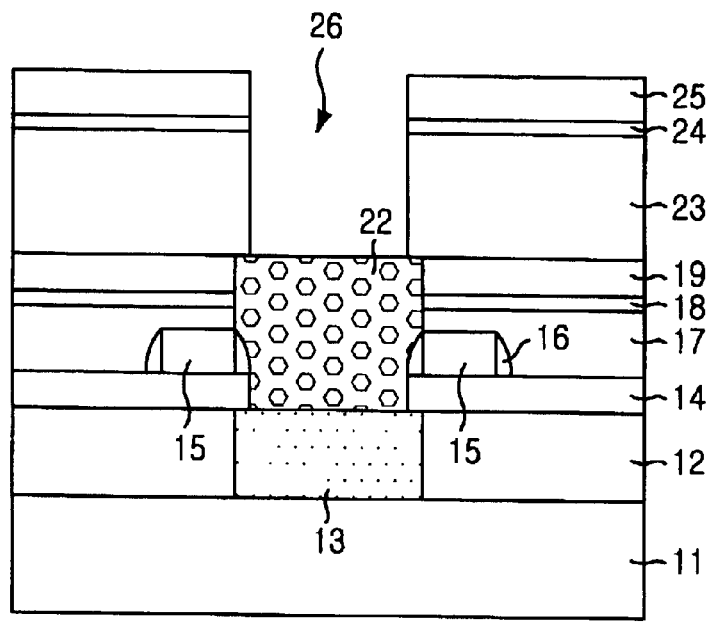
Figure 2D:
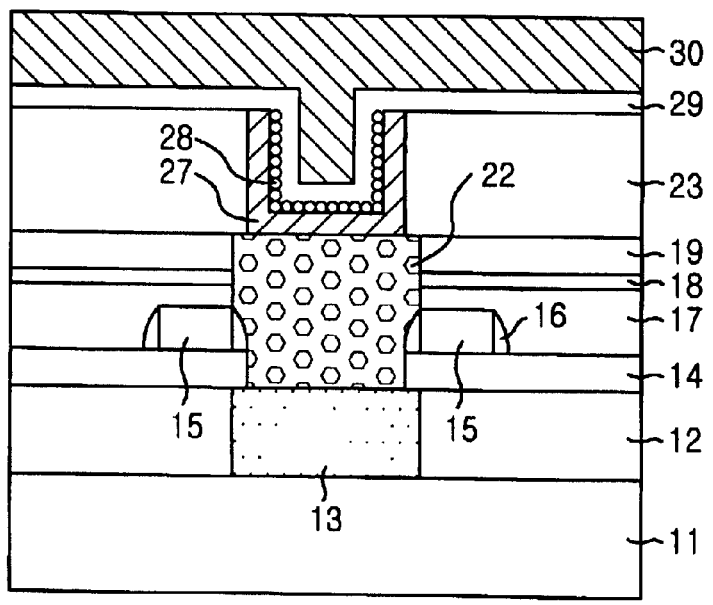
Figure 3A:
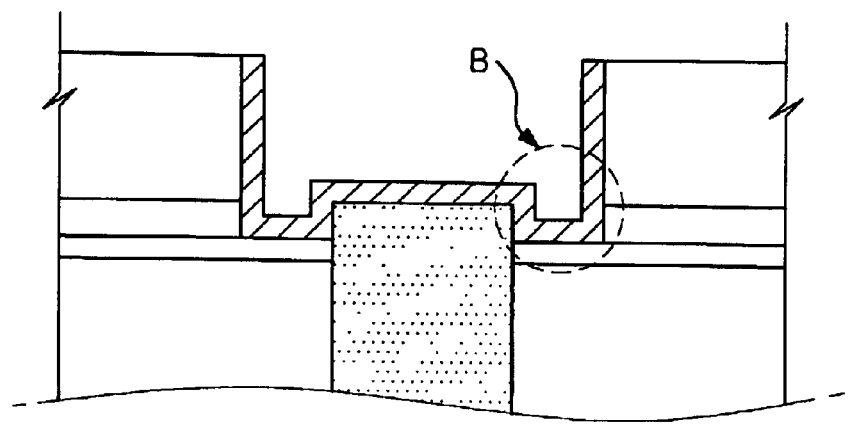
FIG. 3A illustrates an effect of a projection in a storage node contact plug formed by a conventional method.
Figure 3B:
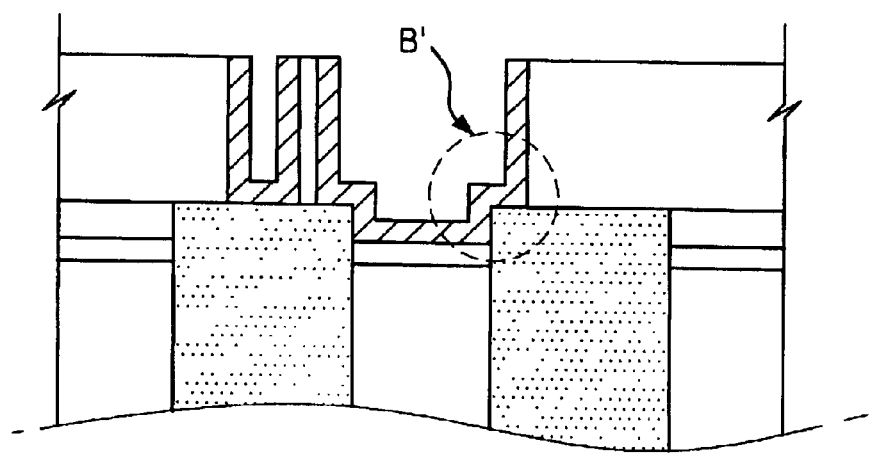
FIG. 3B illustrates the formation of a short circuit between a storage node and an adjacent storage node contact plug by a conventional method.
Figure 4A:
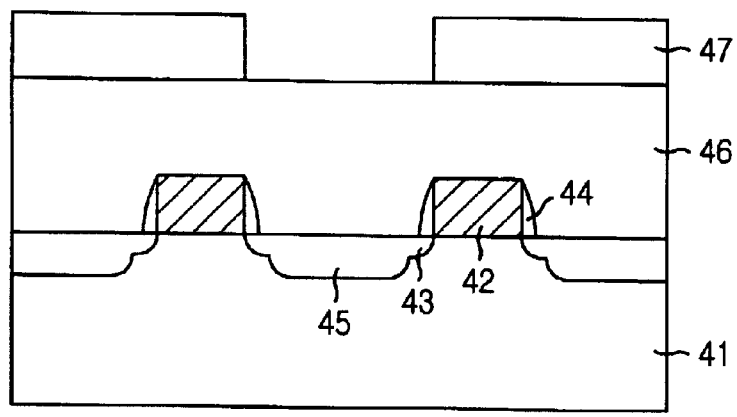
FIGS. 4A to 4D are cross-sectional views showing a contact plug fabrication method according to the present invention.

As shown in FIG. 4A, a word line 42 is formed on a semiconductor substrate 41, with a gate oxide film (not illustrated) involved therein. Then an ion implantation is performed on semiconductor substrate 41 and on the both sides of word line 42, thereby forming an LDD (lightly doped drain) junction 43. Then a spacer insulating film is deposited on the entire surface including word line 42.

Then, the spacer insulating film is etched back to form a word line spacer 44. Word line spacer 44 contacts both of the sidewalls of word line 42. Then an ion implantation is performed using word line spacer 44 and word line 42 as a mask to form a source/drain 45 which is electrically connected to LDD junction 43.

Then, on semiconductor substrate 41 on which word line 42 and source/drain 45 have been formed, an interlayer insulating film (ILD) 46 is deposited and flattened. Then, a contact mask 47 is formed on interlayer insulating film 46 by using a photoresist film.

Figure 4B:
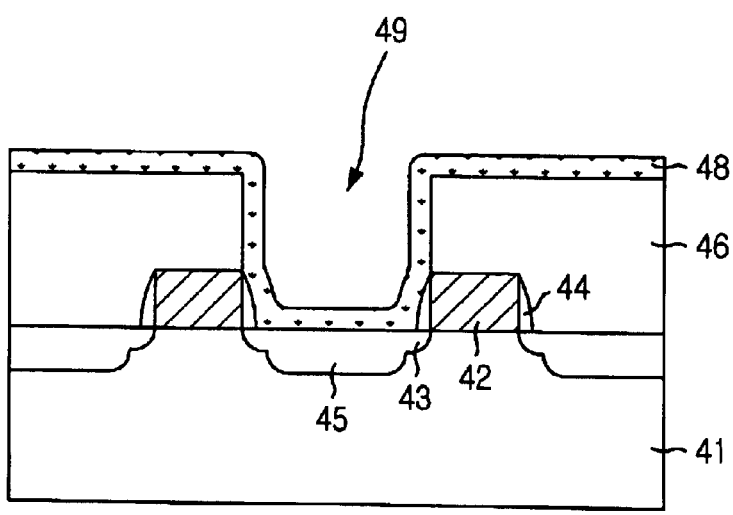

As shown in FIG. 4B, interlayer insulating film 46 is etched by using contact mask 47 to form a contact hole 49 exposing relevant portions of source/drain 45. Then, contact mask 47 is removed. A nitride film 48 is then deposited on the entire surface including contact hole 49.

Figure 4C:
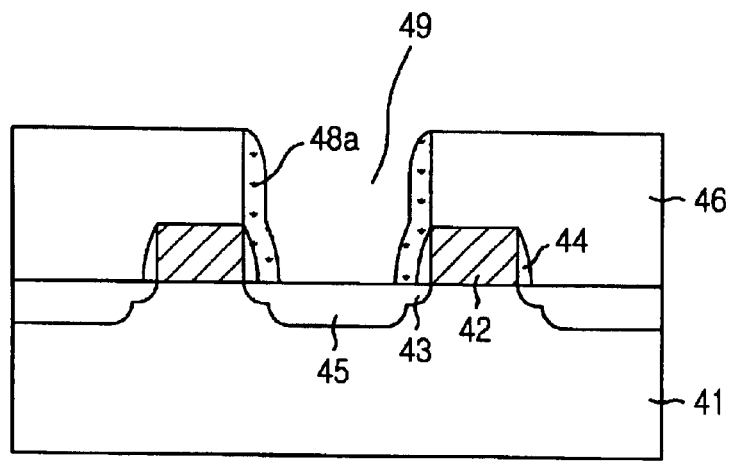

As shown in FIG. 4C, the nitride film 48 is etched away to form a nitride film spacer 48a on the inside wall of contact hole 49. Nitride film spacer 48a is formed to a thickness ranging from 100 Å to 200 Å, and during the etching of the nitride film, an over-etching of 30% is performed, so that any residual nitride film on the source/drain can be removed.

Figure 4D:
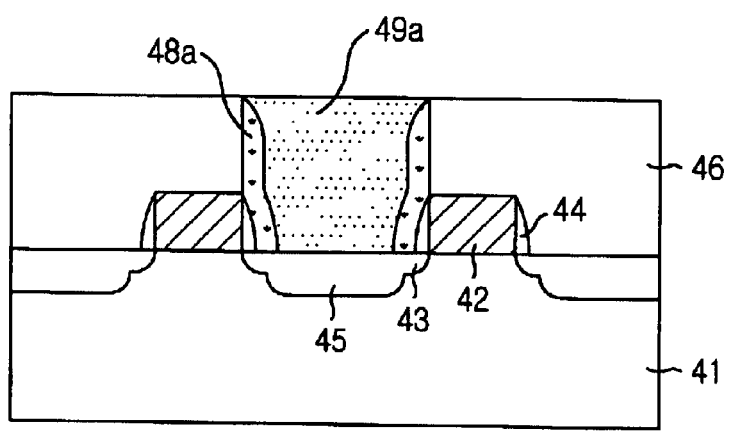

As shown in FIG. 4D, a conductive material for the plug is deposited on interlayer insulating film 46 including contact hole 49 in which nitride film spacer 48a has been formed. Then an etch-back or a chemical-mechanical polishing is performed to form a plug 49a which is buried in contact hole 49.

The conductive material for the plug is one or more material selected from a group consisting of: polysilicon, tungsten (W), tungsten silicide (W-silicide), TiN, TiAlN, TaSiN, TiSiN, TaN, TaAlN, TiSi and TaSi. The conductive film for the plug is deposited by applying a method selected from a group consisting of a chemical vapor deposition method (CVD), a physical vapor deposition method (PVD), and an atomic layer deposition method (ALD).

In the case of deposition of the polysilicon as the conductive material for the plug, a low pressure chemical vapor deposition method (LP-CVD) or a rapid thermal process (RTP) is performed, and thus, a doped polysilicon is deposited in which phosphorus atoms of $2 \times 10^{20}$ atoms/cc or more are doped.

In the above aspect related to the present invention, the nitride spacer is formed on the inside wall of the contact hole prior to the formation of the plug, and therefore, even if a misalignment occurs during the contact mask process, any current leakage between the plug and the bit line can be inhibited.

Figure 5A:
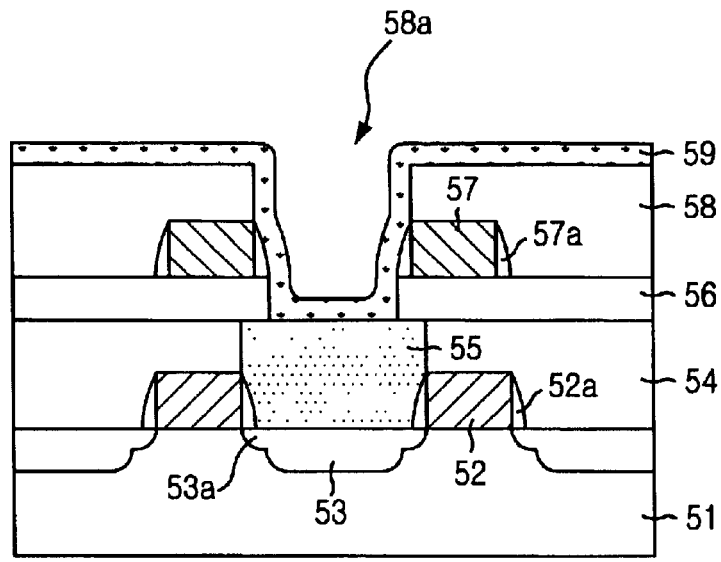
FIGS. 5A to 5J are cross-sectional views showing a semiconductor device fabrication method according to the present invention.

FIGS. 5A to 5H are cross-sectional views showing the semiconductor device fabricating method in another aspect related to the present invention. As shown in FIG. 5A, on a semiconductor substrate 51 on which a transistor has been formed and which includes a word line spacer 52a, a word line 52, and a source/drain 53 of an LDD junction structure 53a, the following process steps are performed. That is, a first interlayer insulating film 54 is deposited, and then, a contact mask (not illustrated) is formed on first interlayer insulating film 54 by using a photoresist film. Then, first interlayer insulating film 54 is etched using the contact mask to form a contact hole thereby exposing source/drain 53. Then, a first conductive film for the plug is deposited on the entire surface, and the first conductive film is selectively removed by etching or chemical-mechanical polishing until the surface of first interlayer insulating film 54 is exposed, thereby forming a first contact plug 55.

In this case, first contact plug 55 contacts a bit line and a storage node contact, which are to be formed later. In the drawing, only the portion where the storage node contact is to be contacted is illustrated.

A second interlayer insulating film 56 is formed on the entire surface, and then, a bit line 57 with a bit line spacer 57a is formed on second interlayer insulating film 56, bit line 57 crosses word line 52. Alternatively, a contact hole is formed prior to the formation of bit line 57, exposing the surface of first contact plug 55. Thus a bit line contact (not illustrated) may be formed to make bit line 57 contact semiconductor substrate 51.

Next, a third interlayer insulating film 58 is formed on the entire surface including bit line 57. A storage node contact mask (not illustrated) is then formed on third interlayer insulating film 58 by using a photoresist film. Third interlayer insulating film 58 and second interlayer insulating film 56 are etched to form a contact hole 58a for a storage node contact plug, thereby exposing the surface of first contact plug 55 between bit line 57 and word line 52.

In this step, during the etching of second and third interlayer insulating films 56 and 58, an over-etching of about 30% is performed, thereby completely exposing first contact plug 55. Then, a first nitride film 59 is deposited on the entire surface including contact hole 58a.

Figure 5B:
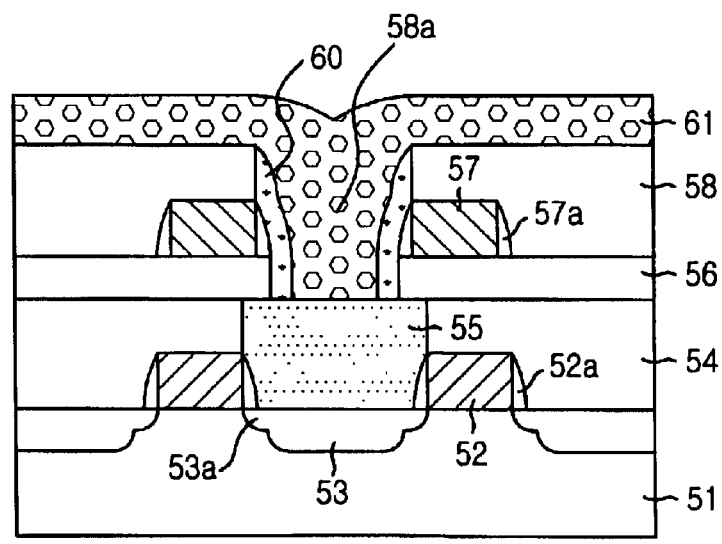

As shown in FIG. 5B, first nitride film 59 is thoroughly etched to form a nitride film spacer 60 on the sidewalls of contact hole 58a, and then, a second conductive film 61 is deposited on the entire surface including nitride film spacer 60.

In this step, an over-etching of 30% is performed during the thorough etching of first nitride film 59 which is formed by using tungsten or polysilicon. In the case where the polysilicon is used, a low pressure chemical vapor deposition method (LP-CVD) or a rapid thermal process (RTP) is employed, with a doping concentration preferably of $2 \times 10^{20}$ atoms/cc or more of phosphorus (P).

Figure 5C:
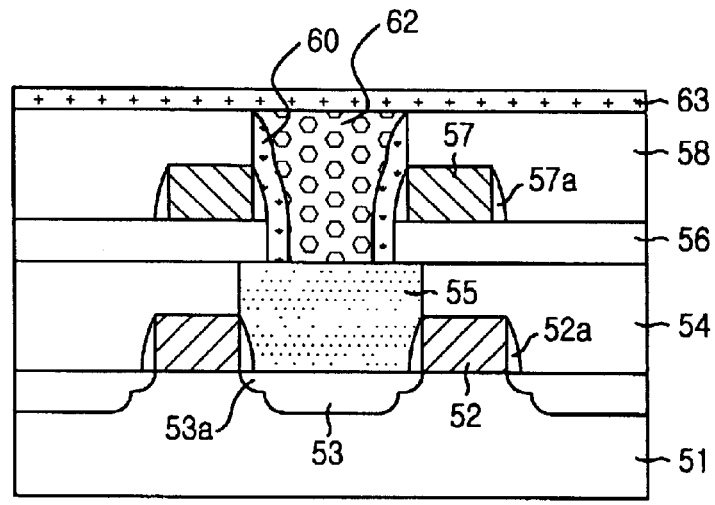

As shown in FIG. 5C, second conductive film 61 is etched back to form a second contact plug 62 (referred to as "storage node plug' below) which is vertically connected to first contact plug 55. Then, a second nitride film 63 is formed on third interlayer insulating film 58 including storage node contact plug 62.

In this step, second nitride film 63 serves as an etch barrier during a dry etch and a wet etch performed on a capacitor oxide film later. Second nitride film 63 is deposited to a thickness ranging from 200 Å to 800 Å by employing a low pressure chemical vapor deposition method (LP-CVD), a plasma chemical vapor deposition method (PE-CVD), or a rapid thermal process (RTP).

Figure 5D:
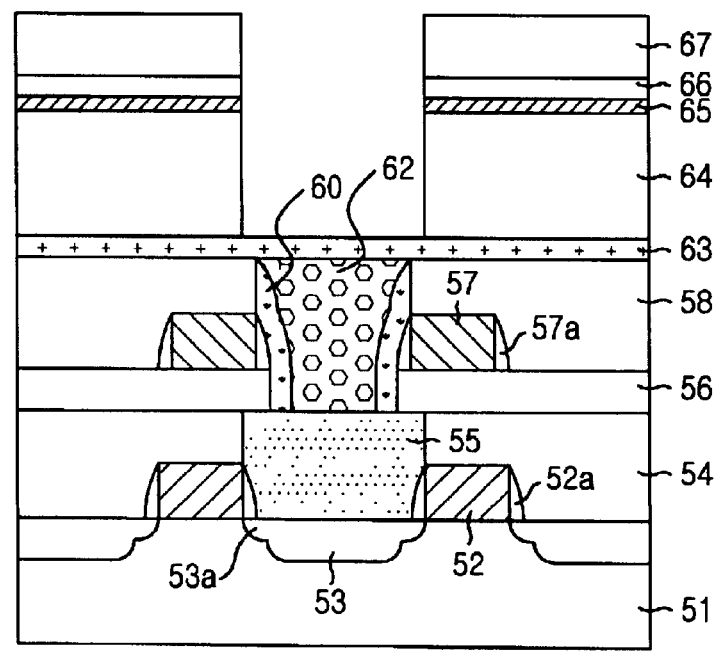

As shown in FIG. 5D, a capacitor oxide film 64, a hard mask 65 and a reflection preventing film 66 are sequentially deposited on second nitride film 63, with capacitor oxide film 64 determining the height and shape of the storage node.

Capacitor oxide film 64 is deposited to a desired thickness by utilizing plasma enhanced tetraethyl orthosilicate (PE-TEOS) or phosphosilicate glass (PSG). Generally, in the case where a wiring process of 0.16 $\mu$m or less is utilized, there is required a deposition thickness of 12,000 Å or more for capacitor oxide film 64, so that a capacitance of 25 fF/cell or more (the area for the storage node) can be obtained.

Further, for hard mask 65, a doped or undoped polysilicon is deposited to have a thickness ranging from 500 Å to 2000 Å at a temperature of 500° C. to 650° C.

Further, to form reflection preventing film 66, an inorganic material (such as SiON) or organic material is deposited or coated to have a thickness ranging from 300 Å to 1000 Å, so that the forthcoming masking process may be performed easily.

Then, a storage node mask 67 is formed on reflection preventing film 66 by using a photoresist film. Reflection preventing film 66, hard mask 65, and capacitor oxide film 64 are etched by utilizing storage node mask 67.

In this step, in order to make second nitride film 63 serve as an etch barrier during etching of capacitor oxide film 64, there should be adopted an etch selectivity ratio of 5:1 to 20:1 between capacitor oxide film 64 and second nitride film 63.

Figure 5E:
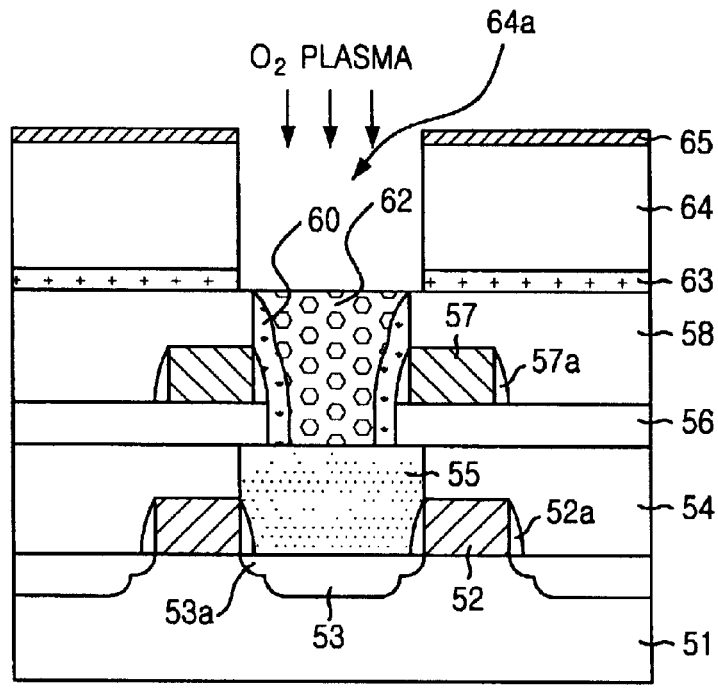

As shown in FIG. 5E, the photoresist film, i.e., storage node mask 67 is stripped. In this step, reflection preventing film 66 which is made of a material similar to that of the photoresist film is removed simultaneously.

Then, second nitride film 63, which has been exposed upon etching capacitor oxide film 64, is etched by using residual hard mask 65 as the etch mask (after removing reflection preventing film 66). Thus a concave part 64a is formed to expose the surface of storage node contact plug 62. In this step, second nitride film 63 is over-etched by 10% to 50%, thereby completely exposing the surface of storage node contact plug 62.

After etching of second nitride film 63, a light dry etching is carried out using oxygen ($O_2$) plasma, so that the foreign materials on the surface of storage node contact plug 62 can be removed once more, thereby decreasing the boundary resistance between the storage node and storage node contact plug 62.

Figure 5F:
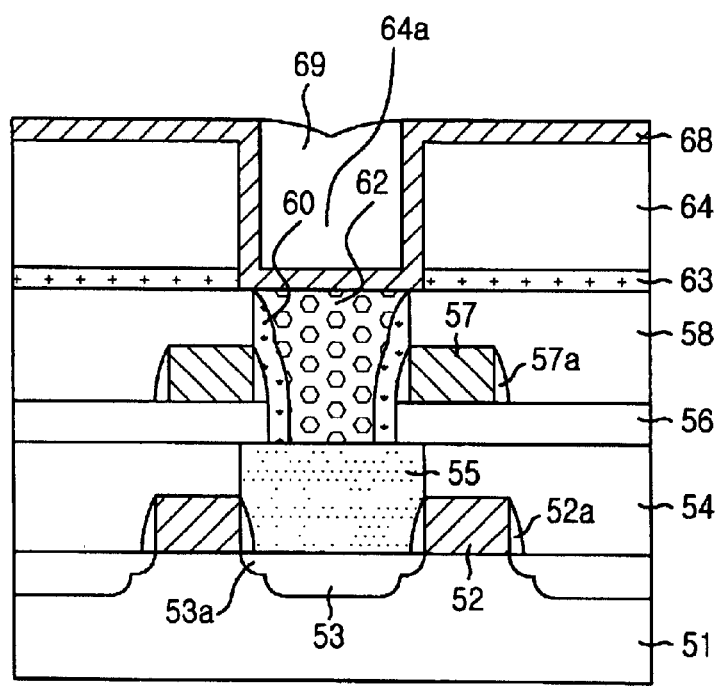

As shown in FIG. 5F, residual hard mask 65 is removed in such a manner that an entire etch-back is carried out, thereby making the residual hard mask remain on the cell regions and on the peripheral circuit regions.

Then, a third conductive film 68 is deposited on the entire surface including concave part 64a, and then, a photoresist film 69 is deposited to have a thickness ranging from 0.5 $\mu$m to 1.5 $\mu$m on the entire surface including third conductive film 68. Then, an etch-back is carried out to expose the upper face of third conductive film 68, and thus, photoresist film 69 remains only in the concave part.

Figure 5G:
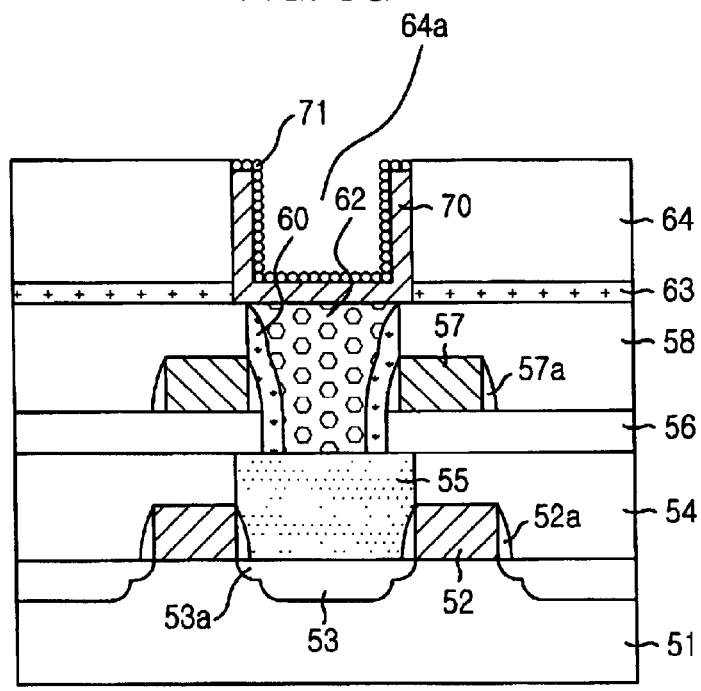

As shown in FIG. 5G, without removing residual photoresist film 69, third conductive film 68 (not shown) is etched back to form a storage node 70 within concave part 64a, and then, residual photoresist film 69 is removed.

In this step, third conductive film 68 is formed into the storage node 70. Third conductive film 68 comprises one or more materials selected from the group consisting of: a silicon-based material such as a doped polysilicon (D-poly Si) and a doped non-crystalline silicon; metals such as TiN, TaN, W, WN, Ru, Ir, and Pt; metal oxides such as $RuO_2$ and $IrO_2$; and WSi. In the case where polysilicon is used for storage node 70, the polysilicon is etched by only 300 Å to 1000 Å when forming storage node 70.

Thus, when forming storage node 70, etching results in more etching on the polysilicon due to the selection ratio between the capacitor oxide film and the polysilicon of the first conductive film, with the result that the capacitor oxide film protrudes up. Then, prominences, such as MPS 71, are grown on the surface of storage node 70.

Figure 5H:
Figure 5H:
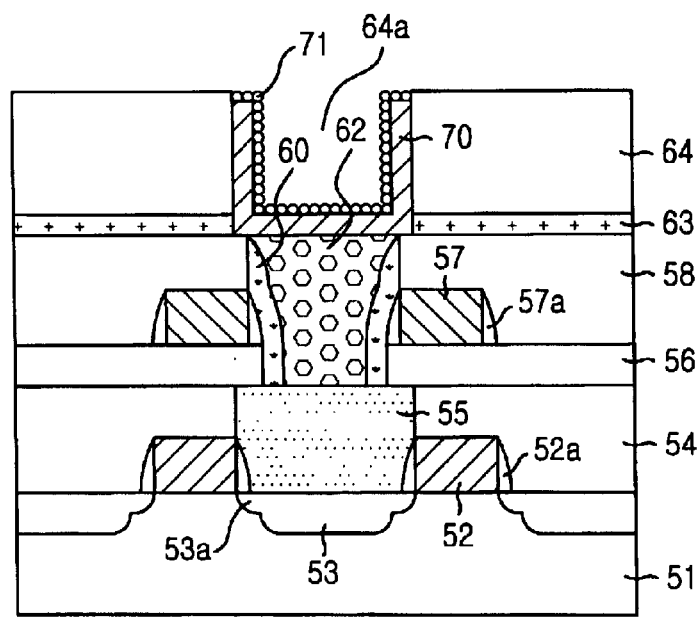

As shown in FIG. 5H, after the growing of MPS 71, a doping is performed under a P (phosphorus)-containing atmosphere. In this step, when a negative bias is supplied, a P depletion region is formed to reduce capacitance. In order to prevent this phenomenon, the doping process is performed.

One example of a doping process is a thermal doping that is performed under a phosphorus gas atmosphere ranging from 1% to 5% $PH_3/N_2$ or $PH_3/H_3$, 50 sccm to 2000 sccm. In this case, the thermal doping is performed at a low temperature of 600±50° C. for 30 to 120 minutes under a pressure ranging from 1 to 100 Torr within an electric furnace.

A second example of the doping is a plasma glow discharge that is performed with an radio frequency (RF) power of ranging from 100 W to 500 W for 30 to 120 seconds under a $PH_3$ atmosphere.

A third example of the doping is the rapid thermal process (RTP) in which a radiation heat is utilized at a temperature ranging from 750° C. to 950° C. for 30 to 120 seconds under a $PH_3$ atmosphere.

Figure 5I:
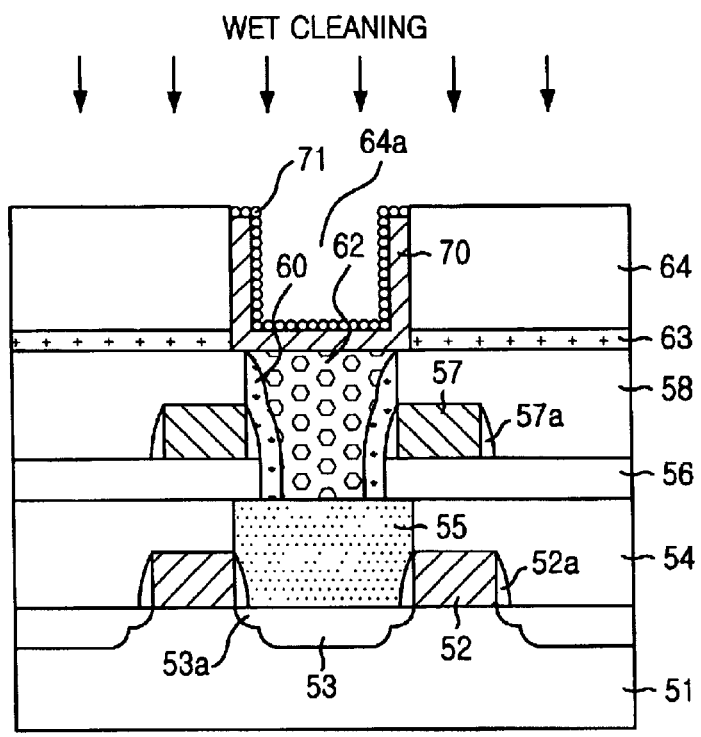

As shown in FIG. 5I, a wet cleaning is performed in order to remove organic and metallic components and naturally formed oxide films before performing the doping, so that the doping effect can be maximized. The wet cleaning is performed in two stages. That is, a first stage is performed with a sulfuric acid solution, and a second stage is performed with a fluoric acid solution.

Figure 5J:
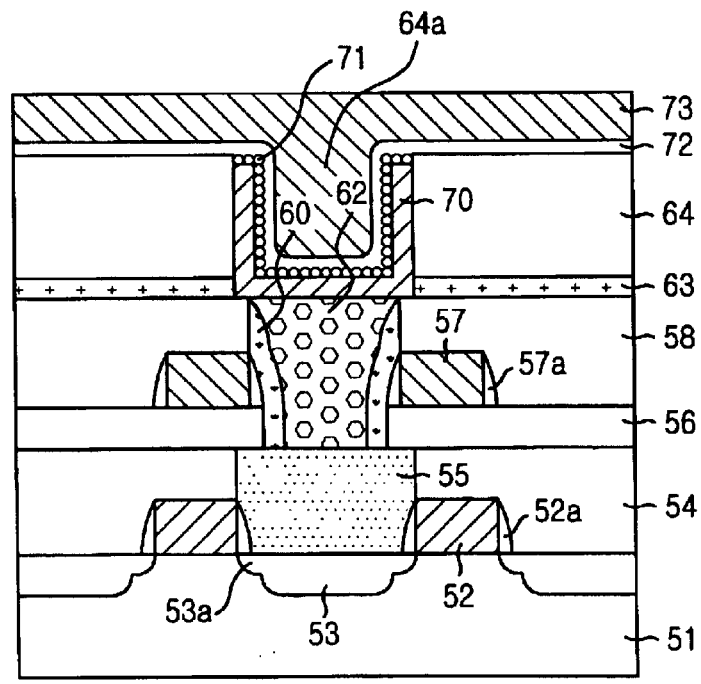

As shown in FIG. 5J, a dielectric film 72 is formed on storage node 70 on which MPS 71 has been formed, and then, a plate node 73 is formed upon dielectric film 72, thereby completing the concave capacitor of the present invention.

In this step, plate node 73 is formed of the same material as that of storage node 70. That is, it is formed with one or more material selected from the group consisting of: a silicon-based material such as a doped polysilicon (D-poly Si) and a doped non-crystalline silicon; metals such as TiN, TaN, W, WN, Ru, Ir and Pt; and metal oxides such as $RuO_2$ and $IrO_2$.

In the case where plate node 73 is formed with TiN, a doped polysilicon film can be stacked as a shock-absorbing layer, so that structural stability can be obtained, and so that the life expectancy of TiN can be extended by protecting against thermal and electrical shocks.

Figure 6:
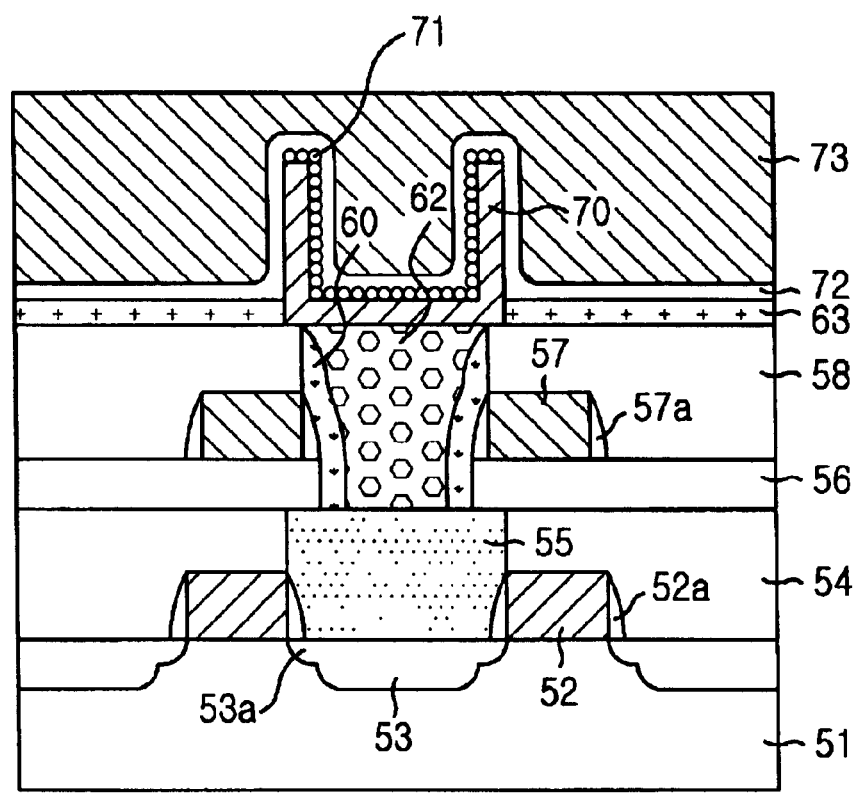
FIG. 6 illustrates a semiconductor device which is fabricated according to the present invention.

In order to ensure the capacitance, storage node 70 may be formed in a three-dimensional shape such as double or triple structures including a cylindrical structure as illustrated in FIG. 6, with prominences, such as MPS, being added.

Dielectric film 72 may consist of a ferroelectric film or a high dielectric constant film selected from the group consisting of: $Ta_2O_5$; STO ($SrTiO_3$); BST (($BaSr$)$TiO_3$); PZT ((Pb) (Zr, Ti)$O_3$); PLZT((Pb, La) (Zr, Ti)$O_3$); BTO ($BaTiO_3$); PMN (Pb(Ng⅓Nb⅔)$O_3$); SBTN ((Sr,Bi)(Ta, Nb)$_2O_9$); SBT ((Sr, Bi)$Ta_2O_9$); BLT ((Bi, La)$Ti_3O_{12}$); BT ($BaTiO_3$); ST ($SrTiO_3$); and PT ($PbTiO_3$).

FIG. 6 illustrates the semiconductor device fabricated according to another aspect related to the present invention. Referring to FIG. 6, the process is performed in the same manner as that of the process illustrated in FIGS. 5A–5H up to the formation of dielectric film 72. However, prior to the formation of dielectric film 72, capacitor oxide film 64 is wet-removed to make only storage node 70 remain. Then, dielectric film 72 and plate node 73 are deposited, thereby forming a cylindrical capacitor.

Figure 7:
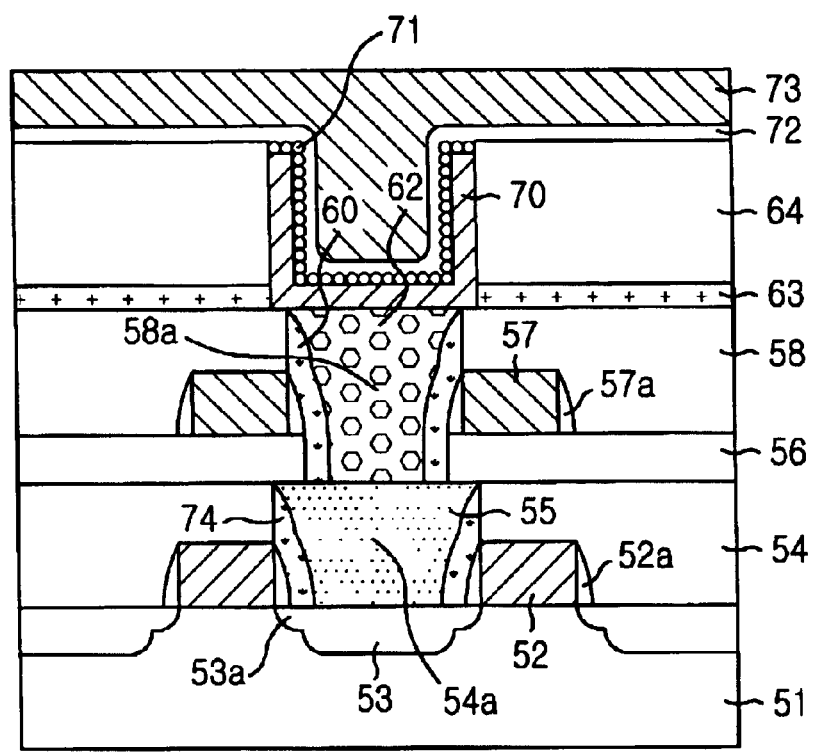
FIG. 7 illustrates a semiconductor device which is fabricated according to the present invention.

FIG. 7 illustrates the semiconductor device fabricated according to another aspect related to the present invention. Referring to FIG. 7, the process is performed in the same manner as that of the process illustrated in FIG. 5A–5H, except that a nitride film spacer 74 is formed on the wall of each of contact holes 54a and 58a for first and second contact plugs 55 and 62.

That is, nitride film spacers 60 and 74 are formed on the walls of contact holes 54a and 58a prior to depositing first and second contact plugs 55 and 62. Accordingly, even if a misalignment occurs during the contact masking process, any current leakage can be prevented between first contact plug 55 and word line 52 and between second contact plug 62 and bit line 57.

In the processes illustrated in FIGS. 6 and 7, the dielectric film consists of a ferroelectric film or a high dielectric constant film selected from the group consisting of: $Ta_2O_5$; STO ($SrTiO_3$); BST (($BaSr$)$TiO_3$); PZT ((Pb) (Zr, Ti)$O_3$); PLZT ((Pb, La) (Zr, Ti)$O_3$); BTO ($BaTiO_3$); PMN (Pb (Ng⅓Nb⅔)$O_3$); SBTN ((Sr,Bi)(Ta, Nb)$_2O_9$); SBT ((Sr, Bi)$Ta_2O_9$); BLT ((Bi, La)$Ti_3O_{12}$); BT ($BaTiO_3$); ST ($SrTiO_3$); and PT ($PbTiO_3$).

Dielectric film 72 is deposited by applying one method selected from among a metal organic deposition method, a zol gel method, a spin-on method, a chemical deposition method (CVD), an atomic layer deposition method (ALD), and a physical vapor deposition method (PVD).

Storage node 70 and plate node 73 are formed with one material selected from the group consisting of: a silicon-based material such as a doped polysilicon (D-poly Si) and a doped non-crystalline silicon; metals such as TiN, TaN, W, WN, Ru, Ir and Pt; metal oxides such as $RuO_2$ and $IrO_2$; and WSi.

Particularly, in the case where plate node 73 is formed with TiN, a doped polysilicon film can be stacked, so that structural stability can be obtained, and the life expectancy of TiN can be extended by protecting against thermal and electrical shocks.

In order to ensure the capacitance, there may be formed a three-dimensional shape such as double or triple structures including a cylindrical structure, with prominences, such as the MPS being added.

The present invention is applicable not only to capacitors connected to a source/drain, but also to capacitors connected to a conductive layer such as a gate electrode. Further, it can be applied not only to a capacitor over bit line (COB) structure, but also to a capacitor under bit line (CUB) structure of semiconductor devices.

According to the present invention as described above, even if a misalignment occurs during a storage node masking process, any current leakage can be inhibited between bit lines and storage node contact plugs.

Further, an etch-back is performed for isolating the storage nodes from each other, and then, MPS is formed, so that the formation of any bridge between storage nodes can be inhibited, thereby preventing any electrical defects such as double-bit defects.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a capacitor, comprising:
   forming a first insulating film on a semiconductor substrate;
   forming a contact plug through the first insulating film;
   sequentially forming an etch barrier film and a second insulating film upon the first insulating film;
   sequentially etching the second insulating film and the etch barrier film to form an opening part so as to expose the contact plug;
   forming a conductive film on the second insulating film and on the opening part;
   selectively etching the conductive film, wherein the conductive film is over-etched relative to the second insulating film, so as to form a storage node within the opening part;
   forming prominences on a surface of the storage node; and
   sequentially forming a dielectric film and a plate node upon the storage node and the second insulating film.

2. The method as claimed in claim 1, wherein forming the storage node comprises:
   depositing a photoresist film on the conductive film;
   etching back the photoresist film so as to make the photoresist film remain only in the opening part;
   etching back the conductive film to form the storage node, with residual photoresist film being left intact; and
   removing the residual photoresist film.

3. The method as claimed in claim 1, wherein forming the opening part comprises:
   forming a hard mask on the second insulating film;
   forming a second mask on the hard mask;
   etching the hard mask and the second insulating film by using the second mask as an etch mask so as to make the etching stop at the etch barrier film;
   removing the second mask;
   etching the etch barrier film by using the hard mask as an etch mask; and
   carrying out a plasma treatment on a top of the contact plug, the top of the contact plug having been exposed upon etching the etch barrier film.

4. The method as claimed in claim 3, wherein the hard mask is formed to a thickness ranging from 500 Å to 2000 Å by using doped or undoped polysilicon.

5. The method as claimed in claim 1, wherein forming the prominences comprises:

growing a silicon-containing material on the storage node;

wet-cleaning the storage node; and doping phosphorus into the storage node after the wet cleaning.

6. The method as claimed in claim 5, wherein the wet-cleaning comprises:

a first cleaning the storage node using a sulfuric acid solution; and a second cleaning the storage node using a fluoric acid solution.

7. The method as claimed in claim 5, wherein during doping the phosphorus, a thermal doping is performed under a 1% to 5% $PH_3/N_2$ or $PH_3$/He gas atmosphere having a flow rate ranging from 50 sccm to 2000 sccm.

8. The method as claimed in claim 7, wherein the thermal doping is performed at a temperature of 600° C.±50° C. for 30 to 120 minutes at a pressure ranging from 1 Torr to 100 Torr.

9. The method as claimed in claim 8, wherein the thermal doping is performed in an electric furnace.

10. The method as claimed in claim 5, wherein at the step of doping the phosphorus, a plasma glow discharge is performed for 30 to 120 seconds with an RF power ranging from 100 W to 500 W under a $PH_3$ atmosphere within a chamber.

11. The method as claimed in claim 5, wherein during doping the phosphorus, a rapid thermal process is performed at a temperature ranging from 750° C. to 950° C. for 30 to 120 seconds under a $PH_3$ atmosphere.

12. The method as claimed in claim 2, wherein the photoresist film is spread to a thickness ranging from 0.5 μm to 1.5 μm.

13. The method as claimed in claim 1, wherein the conductive film is formed to a thickness ranging from 300 Å to 600 Å.

14. The method as claimed in claim 1, wherein the conductive film is made of one or more materials selected from the group consisting of a doped polysilicon, a doped non-crystalline silicon, TiN, TaN, W, WN, Ru, Ir Pt, $RuO_2$, $IrO_2$ and WSi.

15. A method for fabricating a semiconductor device, comprising:

forming a first insulating film on a semiconductor substrate;

forming a plurality of bit lines on the first insulating film;

forming a contact hole through the first insulating film between the bit lines reaching the semiconductor substrate;

forming a spacer on a sidewall of the contact hole;

forming a first contact plug, the first contact plug being buried into the contact hole reaching the semiconductor substrate;

sequentially forming an etch barrier film and a second insulating film on the first insulating film and on the first contact plug;

sequentially etching the second insulating film and the etch barrier film to form an opening part so as to expose the first contact plug;

forming a first conductive film on an entire surface including the opening part;

selectively etching the first conductive film, with the first conductive film being over-etched relative to the second insulating film, so as to form a storage node within the opening part; and sequentially forming a dielectric film and a plate node upon the storage node.

16. The method as claimed in claim 15, wherein forming the spacer comprises:

depositing a nitride film on an entire surface including the contact hole; and thoroughly etching the nitride film.

17. The method as claimed in claim 15, wherein forming the storage node comprises:

spreading a photoresist film on the first conductive film;

etching back the photoresist film to make it remain only in the opening part;

etching back the first conductive film to form the storage node, with residual photoresist film being left intact; and removing the residual photoresist film.

* * * * *